(12) United States Patent
Melanson

(10) Patent No.: US 7,190,294 B2
(45) Date of Patent: Mar. 13, 2007

(54) JOINTLY NONLINEAR DELTA SIGMA MODULATORS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 165 days.

(21) Appl. No.: 11/035,288

(22) Filed: Jan. 13, 2005

(65) Prior Publication Data

US 2005/0156770 A1    Jul. 21, 2005

Related U.S. Application Data

(60) Provisional application No. 60/588,951, filed on Jul. 19, 2004, provisional application No. 60/539,132, filed on Jan. 26, 2004, provisional application No. 60/537,285, filed on Jan. 16, 2004.

(51) Int. Cl.
    *H03M 3/00* (2006.01)
(52) U.S. Cl. ..................... 341/143; 341/144
(58) Field of Classification Search ............. 341/143, 341/155, 144
    See application file for complete search history.

(56) References Cited

U.S. PATENT DOCUMENTS

| | | | |
|---|---|---|---|
| 5,548,286 A | 8/1996 | Craven | 341/144 |
| 5,550,544 A | 8/1996 | Sakiyama et al. | 341/155 |
| 5,585,801 A | 12/1996 | Thurston | 341/143 |
| 5,598,159 A | 1/1997 | Hein | 341/143 |
| 5,708,433 A | 1/1998 | Craven | 341/144 |
| 5,742,246 A * | 4/1998 | Kuo et al. | 341/143 |
| 5,757,300 A | 5/1998 | Koilpillai et al. | 341/143 |
| 5,757,517 A | 5/1998 | Couwenhoven et al. | 358/463 |
| 5,786,779 A | 7/1998 | Chun et al. | 341/61 |
| 5,977,899 A | 11/1999 | Adams et al. | 341/145 |
| 6,067,515 A | 5/2000 | Cong et al. | 704/243 |

(Continued)

FOREIGN PATENT DOCUMENTS

| | | |
|---|---|---|
| EP | 1227595 | 7/2002 |
| JP | 2003-124812 | 4/2003 |

OTHER PUBLICATIONS

J. Paulos et al., "Improved Signal-To-Noise Ratio Using Tri-Level Delta-Sigma Modulation," Reprinted from IEEE Proc. ISACS, May 1987, pp. 245-248.

(Continued)

*Primary Examiner*—Peguy JeanPierre
(74) *Attorney, Agent, or Firm*—Hamilton & Terrile, LLP; Kent B. Chambers

(57) ABSTRACT

A signal processing system includes a jointly non-linear delta sigma modulator. In one embodiment, the jointly non-linear delta sigma modulator includes a non-linear quantization transfer function, and the output of the delta sigma modulator is defined, at least in part, by a non-linear interrelationship of multiple noise-shaping filter state variables. A look-ahead delta-sigma modulator can be implemented as a noise shaping filter and a function generator. State variables of the noise shaping filter provide the input data from which the function generator determines a quantizer output signal. Latter state variables are more dominant in determining the quantizer output signal. Accordingly, earlier state variables can be approximated to a greater degree than latter state variables without significant compromise in quantization accuracy.

25 Claims, 16 Drawing Sheets

U.S. PATENT DOCUMENTS

| | | | | |
|---|---|---|---|---|
| 6,070,136 | A | 5/2000 | Cong et al. | 704/222 |
| 6,112,218 | A | 8/2000 | Gandhi et al. | 708/320 |
| 6,160,505 | A | 12/2000 | Vaishampayan | 341/143 |
| 6,177,897 | B1 | 1/2001 | Williams, III | 341/150 |
| 6,232,899 | B1 | 5/2001 | Craven | 341/126 |
| 6,310,518 | B1 | 10/2001 | Swanson | 330/282 |
| 6,313,773 | B1 | 11/2001 | Wilson et al. | 341/143 |
| 6,347,297 | B1 | 2/2002 | Asghar et al. | 704/243 |
| 6,362,769 | B1 | 3/2002 | Hovin et al. | 341/157 |
| 6,373,416 | B1 | 4/2002 | McGrath | 341/143 |
| 6,392,576 | B1 | 5/2002 | Wilson et al. | 341/143 |
| 6,418,172 | B1 | 7/2002 | Raghavan et al. | 375/262 |
| 6,480,129 | B1 * | 11/2002 | Melanson | 341/143 |
| 6,480,528 | B1 | 11/2002 | Patel et al. | 375/148 |
| 6,501,404 | B2 | 12/2002 | Walker | 341/143 |
| 6,590,512 | B2 | 7/2003 | Roh et al. | 341/143 |
| 6,639,531 | B1 | 10/2003 | Melanson | 341/143 |
| 6,724,332 | B1 | 4/2004 | Melanson | 341/143 |
| 6,760,573 | B2 | 7/2004 | Subrahmanya et al. | 455/192.2 |
| 6,822,594 | B1 | 11/2004 | Melanson et al. | 341/143 |
| 6,842,128 | B2 | 1/2005 | Koh | 341/143 |
| 6,842,486 | B2 | 1/2005 | Plisch et al. | 375/247 |
| 6,861,968 | B2 | 3/2005 | Melanson | 341/143 |
| 6,873,278 | B1 | 3/2005 | Ferguson et al. | 341/144 |
| 6,873,280 | B2 | 3/2005 | Robinson et al. | 341/159 |
| 6,879,275 | B1 | 4/2005 | Melanson | 341/143 |
| 6,888,484 | B2 | 5/2005 | Kiss et al. | 341/143 |
| 6,933,871 | B2 | 8/2005 | Melanson | 341/143 |
| 6,940,434 | B2 | 9/2005 | Brooks | 341/131 |
| 6,956,514 | B1 | 10/2005 | Melanson et al. | 341/143 |
| 6,967,606 | B2 | 11/2005 | Wiesbauer et al. | 341/143 |
| 2003/0086366 | A1 | 5/2003 | Branlund et al. | 370/208 |
| 2003/0231729 | A1 | 12/2003 | Chien et al. | 375/376 |
| 2005/0012649 | A1 | 1/2005 | Adams et al. | 341/143 |
| 2005/0052300 | A1 * | 3/2005 | Ranganathan | 341/143 |

OTHER PUBLICATIONS

E. Knapen et al., "Lossless Compression of 1-Bit Audio," J. Audio Eng. Soc., vol. 52, No. 3, Mar. 2004, pp. 190-199.

Angus, James A.S., "Tree Based Lookahead Sigma Delta Modulators," Audio Engineering Society 114th Convention, Convention Paper 5825, Mar. 22-25, 2003, p. 1-8.

Harpe, Pieter, et al., "Efficient Trellis-Type Sigma Delta Modulator," Audio Engineering Society 114th Convention, Convention Paper 5845, Mar. 22-25, 2003, p. 1-8.

Hawksford, M.O.J., "Parametrically Controlled Noise Shaping in Variable State-Step-Back Pseudo-Trellis SDM," Audio Engineering Society 115th Convention, Convention Paper, Oct. 10-13, 2003, p. 1-14.

Kato, Hiroshi, "Trellis Noise-Shaping Converters and 1-bit Digital Audio," Audio Engineering Society 112th Convention, Convention Paper 5615, May 10-13, 2002.

Sony Electronics, Inc. and Philips Electronics N.V., "Super Audio Compact Disc, A Technical Proposal," 1997, p. 1-12.

Zetterberg, L.H. et al., "Adaptive Delta Modulation with Delayed Decision," IEEE Transactions on Communications, IEEE vol. COM-22, No. 9, Sep. 1974, pp. 1195-1198.

Stonick, J.T. et al., "Look-Ahead Decision-Feedback $\Sigma\Delta$ Modulation," IEEE International Conference on Acoustics, Speech and Signal Processing, New York, 1994, p. 541-544.

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of $3^{rd}$ Order Sigma-Delta Modulators via FPGA Implementation," ASIC/SOC Conference, 2001, Proceedings, 14th Annual IEEE International Sep. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, 1995, pp. 1-6.

Lindfors, S., "A Two-Step Quantization $\Delta\Sigma$-Modulator Architecture with Cascaded Digital Noise Cancellation," Electronics, Circuits and Systems, 2000, ICECS, The 7th IEEE International Conference, Dec. 17-20, 2000, vol. 1, pp. 125-128.

Harris, F.J. et al., "Implementeation Considerations and Limitations for Dynamic Range Enhanced Analog to Digital Converters," IEEE International Conference on Acoustics, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 IEEE International Symposium, May 31-Jun. 3, 1998, vol. 1, pp. 583-586.

* cited by examiner

JOINTLY NONLINEAR DELTA SIGMA MODULATORS

CROSS-REFERENCE TO RELATED APPLICATIONS

This application claims the benefit under 35 U.S.C. § 119(e) of (i) U.S. Provisional Application No. 60/537,285, filed Jan. 16, 2004 and entitled "Look-Ahead Delta-sigma Modulators", (ii) U.S. Provisional Application No. 60/539,132, filed Jan. 26, 2004 and entitled "Signal Processing Systems with Look-Ahead Delta-Sigma Modulators", and (iii) U.S. Provisional Application No. 60/588,951, filed Jul. 19, 2004 and entitled "Signal Processing Systems with Look-Ahead Delta-Sigma Modulators". Provisional applications (i) through (iii) include example systems and methods and are incorporated by reference in their entireties.

BACKGROUND OF THE INVENTION

1. Field of the Invention

The present invention relates in general to the field of information processing, and more specifically to a system and method for quantizing signals using jointly nonlinear delta-sigma modulators.

2. Description of the Related Art

Many signal processing systems include delta sigma modulators to quantize an input signal into one or more bits. Delta sigma modulators trade-off increased noise in the form of quantization error in exchange for high sample rates and noise shaping. "Delta-sigma modulators" are also commonly referred to using other interchangeable terms such as "sigma-delta modulators", "delta-sigma converters", "sigma delta converters", and "noise shapers".

FIG. 1 depicts a conventional delta sigma modulator 100 that includes a monotonic quantizer 102 for quantizing a digital input signal x(n), where "x(n)" represents the $n^{th}$ input signal sample. The delta sigma modulator 100 also includes an exemplary fourth ($4^{th}$) order noise shaping loop filter 104 that pushes noise out of the signal band of interest. The output data of each stage 106(1), 106(2), 106(3), and 106(4) of the filter 104 is represented by respective state variables SV1, SV2, SV3, and SV4 of filter 104. The state variables are updated once during each operational period T. The quantizer input signal s(n) is determined from a linear combination of the state variables in accordance with the topology of filter 104. The complete quantizer input signal s(n) is determined from the state variables modified by feed-forward gains d1 through d4 and input signal x(n) modified by feedback coefficient c0 and feed-forward gain d0. For audio signals, the signal band of interest is approximately 0 Hz to 20 kHz. The four feedback coefficients c0, c1, c2, and c3 and/or the feed-forward coefficients set the poles of both the noise transfer function (NTF) and the signal transfer function (STF) of filter 104. In general, there are two common filter topologies, feed-forward and feedback. In the feedback case, the feed-forward coefficients are all zero, except for the last coefficient. In the feed-forward case, all of the feedback coefficients are 0, except for c0, which is usually defined as 1, without any loss of generality. The NTF of filter 104 has four (4) zeros at DC (0 Hz). Local resonators are often added, with feedback around pairs of integrators, in order to move some of the zeroes to frequencies higher in the signal passband. Typical high performance delta sigma modulators include fourth ($4^{th}$) order and higher loop filters although filter 104 can be any order. The NTF often distributes zeros across the signal band of interest to improve the noise performance of the delta sigma modulator 100.

The topology of each stage is a matter of design choice. Stages 106(i) are each represented by the z-domain transfer function of $z^{-1}/(1-z^{-1})$. Group 108 is functionally identical to group 110. Stage 106(1) can be represented by a leading edge triggered delay 112 and feedback 114.

FIG. 2 depicts the quantizer 102 modeled as a gain, g, multiplying the quantizer input signal s(n) plus additive white noise n. The quantizer output noise is then modeled as $n/(1+z^{-1}*g*H(z))$. However, the quantizer output noise model often breaks down because the gain g is actually dependent upon the level (magnitude) of the input signal x(n). Additionally, the additive noise is correlated to the input signal. For low level input signals x(n), a tendency exists for the feedback signal into the quantizer 102 to be low, effectively making the gain high or breaking down the quantizer output noise model altogether. Because one-bit quantizers have no well-defined gain, a high gain for low level quantizer input signals is particularly bad because it can decrease the signal-to-noise ratio (SNR) of the delta sigma modulator 100. Often white noise, or dither, is added to the input of the quantizer in order to aid this situation; however that noise decreases the dynamic range and maximum signal input of the system.

Referring to FIGS. 1, 2, and 3, the quantizer 102 quantizes an input signal x(n) monotonically by making a decision to select the closest feedback value to approximate the input signal. In a one-bit delta sigma modulator, the quantizer has only two legal outputs, referred to as −1 and +1. Therefore, in a one-bit embodiment, quantizer 102 quantizes all positive input signals as a +1 and quantizes all negative input signals as −1. The quantization level changeover threshold 304 is set at DC, i.e. 0 Hz, and may be quantized as +1 or −1.

FIG. 3 graphically depicts a monotonic, two-level quantization transfer function 300, which represents the possible selections of each quantizer output signal y(n) from each quantizer input signal s(n). The diagonal line 302 depicts a monotonic unity gain function and represents the lowest noise quantization transfer function. "Monotonic" is defined by a function that, as signal levels increase, consists of either increasing quantizer output state transitions ("transitions") or decreasing transitions, but not both increasing and decreasing transitions. To mathematically define "monotonically increasing" in terms of quantization, if the transfer function of the quantizer 102 is denoted as Q(s), then $Q(s1) \geq Q(s2)$, for all $s1 > s2$, where "s1" and "s2" represent quantizer input signals. Mathematically defining "monotonically decreasing" in terms of quantization, if the transfer function of the quantizer 102 is denoted as Q(s), then $Q(s1) \geq Q(s2)$, for all $s1 < s2$. Thus, in general, a monotonic quantization transfer function must adhere to Equation 1:

$$Q(s1) > Q(s2), \text{ for all } |s1| > |s2|. \qquad [\text{Equation 1}]$$

In many cases, dithering technology intentionally adds noise to the quantizer input signal s(n) to dither the output decision of quantizer 102. Adding dithering noise can help reduce the production of tones in the output signal y(n) at the cost of adding some additional noise to the delta sigma modulator loop because the quantization noise is generally increased. However, adding dithering noise to the quantizer does not convert a monotonic quantization transfer function into a non-monotonic quantization transfer function. Adding dithering noise merely changes the probability of some quantizer decisions. An alternative perspective regarding dither is to simply add a signal prior to quantization, which has no effect on the quantization transfer function.

Magrath and Sandler in *A Sigma-Delta Modulator Topology with High Linearity*, 1997 IEEE International Symposium on Circuits and Systems, Jun. 9–12, 1987 Hong Kong, (referred to as "Magrath and Sandler") describes a sigma-delta modulator function that achieves high linearity by modifying the transfer function of the quantizer loop to include bit-flipping for small signal inputs to the quantizer. Magrath and Sandler discusses the compromise of linearity of the sigma-delta modulation process by the occurrence of idle tones, which are strongly related to repeating patterns at the modulator output and associated limit cycles in the system state-space. Magrath and Sandler indicates that injection of a dither source before the quantizer is a common approach to linearise the modulator. Magrath and Sandler discusses a technique to emulate dither by approximately mapping the dither onto an equivalent bit-flipping operation.

FIG. 4 graphically depicts the single non-monotonic region quantization transfer function 400 that emulates dither as described by Magrath and Sandler. Quantizer function 400 is necessarily centered around s(n)=0, as described by Magrath and Sandler, to emulate conventional dither. According to Magrath and Sandler, if the absolute value of the input ("|s(n)|" in FIG. 1) to the quantizer is less than B, a system constant, then the quantizer state is inverted as depicted by quantizer function 400.

Input signals s(n) to the quantizer 102 can be represented by probability density functions (PDFs). FIG. 5A depicts PDFs of each quantizer input signal s(n) during operation at small and large input signal levels. PDF 502 represents small signal levels for each signal s(n). The narrow PDF 502 can indicate high delta sigma modulator loop gain g. As the magnitude of signal levels for signal s(n) increase, the PDF of each signal s(n) changes from the narrow PDF 502 to the wider PDF 504.

FIG. 5B depicts a near ideal PDF 500 for each quantizer input signal s(n) because all signals are clustered around the quantization levels +1 and −1. Accordingly, the quantization noise n (error) is very small.

FIG. 6 graphically depicts a convex region 602 and a nonconvex region 604. A set in Euclidean space is a convex set if the set contains all the line segments connecting any pair of points in the set. If the set does not contain all the line segments connecting any pair of data points in the set, then the set is nonconvex (all referred to as "concave"). The convex region 602 includes all sets of data points within the boundaries of convex region 602. As depicted by the example line segments AB and CD, all line segments in convex region 602 connecting any pair of data points are completely contained within convex region 602

Region 604 represents a nonconvex region because there exists at least one line segment AB connecting a pair points {A,B} that is not completely contained within region 603. Thus, by definition, region 604 is a nonconvex region.

FIG. 7 depicts the interrelationship of two state variables SVx and SVy with respect to the output y(n) of a monotonic quantizer 102 (FIG. 1). State variables SVx and SVy represent any respective state variable of filter 104. Line 702 represents the boundary between the +1 quantization region and the −1 quantization region for a quantization output level. The boundary 702 of the quantization regions +1 and −1 is characterized by a linear interrelationship between state variables SVx and SVy. The quantization regions +1 and −1 are also defined by convex boundaries. In the case of a feedback topology for the loop filter, the quantizer is responsive to only one state variable, that being the last (or highest order) one. In the case of a feed-forward filter topology, the relationship illustrated in FIG. 7 is active. In general, the regions will have dimensionality of the order of the filter, e.g., a fourth order filter would have a 4-space diagram. The 2 dimensional diagrams are meant to be representative of a 2-dimensional slice of an actual n-dimensional region functions being depicted.

FIG. 8 depicts the interrelationship between two state variables SVx and SVy with respect to the output y(n) of a bit-flipping quantizer 102. The boundaries between quantization regions A, B, C, and D are linear. The non-monotonic, bit-flipping quantizer 102 has four, convex quantization regions that alternate twice between +1 and −1. The four quantization regions are also defined by a linear relationship for any pair of state variables SVx and SVy. Again, in a higher order system, the actual regions depicted are n-dimensional.

SUMMARY OF THE INVENTION

In one embodiment of the present invention, a signal processing system includes a jointly non-linear delta sigma modulator. The jointly non-linear delta sigma modulator includes a noise shaping filter to process a signal and generate N state variables, wherein N is greater than or equal to two. The jointly non-linear delta sigma modulator also includes a quantizer to quantize quantizer input data determined from at least a subset of the N state variables in accordance with a nonlinear quantization transfer function, wherein one or more boundaries between quantization regions for at least one quantization level are characterized at least in part by a nonlinear interrelationship between at least two of the state variables.

In another embodiment of the present invention, a method of processing a signal using a jointly nonlinear delta-sigma modulator that includes a noise shaping filter having N state variables includes filtering an input signal to the jointly nonlinear delta-sigma modulator using the noise shaping filter to generate respective quantizer input data from the N state variables, wherein N is greater than or equal to two. The method also includes quantizing the quantizer input data in accordance with a nonlinear quantization transfer function, wherein one or more boundaries between quantization regions for at least one quantization level are characterized at least in part by a nonlinear interrelationship between at least two of the state variables.

In another embodiment of the present invention, a method of quantizing an input signal using non-linearly related input data and a nonlinear quantization transfer function includes receiving input signal samples. The method also includes filtering the input signal samples to generate digital filter state variables and applying a nonlinear quantization transfer function to at least a subset of the state variables to generate an output signal, wherein one or more boundaries between quantization regions for at least one quantization level are characterized at least in part by a nonlinear interrelationship between at least two of the state variables.

In a further embodiment of the present invention, an apparatus includes means to filter input signal samples to generate digital filter state variables representing state variables of a multi-order digital filter. The apparatus also includes means to quantize at least a subset of the state variables using a nonlinear quantization transfer function, wherein one or more boundaries between quantization regions for at least one quantization level are characterized at least in part by a nonlinear interrelationship between at least two of the state variables.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system includes ajointly non-linear delta sigma modulator. In one embodiment, the jointly non-linear delta sigma modulator includes a non-linear quantization transfer function, and one or more boundaries between quantization regions of the output of the delta sigma modulator are characterized, at least in part, by a non-linear interrelationship of multiple noise-shaping filter state variables. Thus, in at least one embodiment, "jointly non-linear" refers to a nonlinear quantization transfer function that quantizes an input signal in accordance with discrete one-bit or multi-bit levels together with non-linear quantization region boundaries characterized by a non-linear interrelationship between multiple noise-shaping filter state variables. A look-ahead delta-sigma modulator can be implemented as a noise shaping filter and a function generator. State variables of the noise shaping filter provide the input data from which the function generator determines a quantizer output signal. Latter state variables are more dominant in determining the quantizer output signal. Accordingly, earlier state variables can be approximated to a greater degree than earlier state variables. The approximations can result in slightly lower output signal accuracy, but can significantly decrease implementation cost. Additionally, latter state variables can completely dominate (i.e., be deterministic) the quantizer output signal.

The non-linear interrelationships between N filter state variables can represent an N dimensional set of relationships that characterize the boundaries of the quantization regions of the quantizer output. The quantization regions can be convex or nonconvex. Furthermore, the quantization regions can also include one or more monotonic and/or non-monotonic regions for one-bit and multi-bit delta-sigma modulators. In one embodiment, the jointly non-linear delta sigma modulator includes one or more quantization levels with quantization region boundaries characterized by a non-linear interrelationship between at least two pairs of delta sigma modulator, noise shaping filter state variables. Embodiments of the jointly non-linear nature of the delta sigma modulator improve overall delta sigma modulator performance by increasing computational performance and, with regard to non-monotonic embodiments, making a slightly worse short-term quantization decision in exchange for making better long-term decisions.

Figure 9:
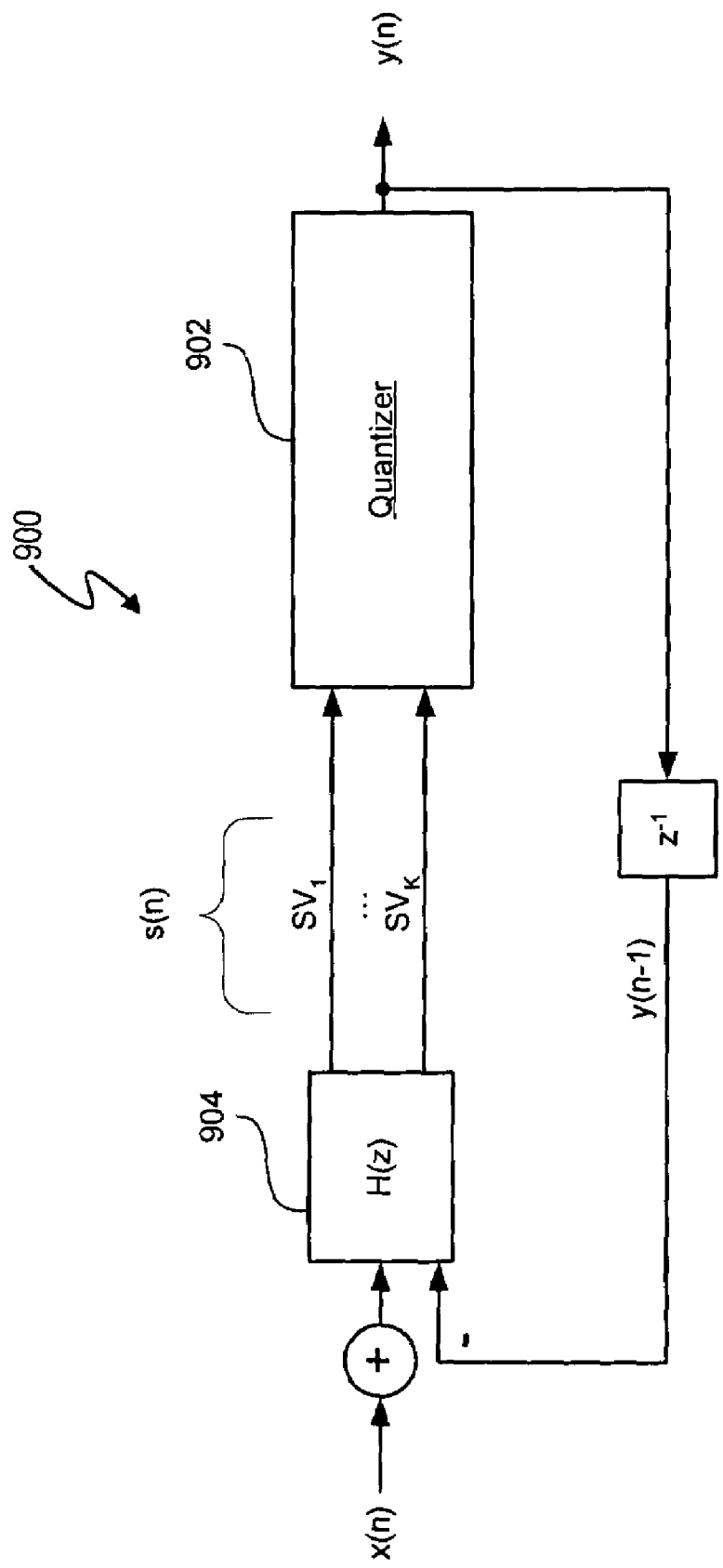
FIG. 9 depicts an exemplary jointly non-linear delta sigma modulator.

FIG. 9 depicts a jointly non-linear delta sigma modulator 900 that quantizes each quantizer input signal s(n) with a quantizer 902. The quantizer input signal s(n) includes state variables $SV_1, \ldots, SV_K$, where K is less than or equal to the total number filter 904 state variables. One or more embodiments of delta sigma modulator 900 is a non-lookahead delta sigma modulator but can be designed to emulate a prototypical look-ahead delta sigma modulator. Filter 904 processes each delta sigma modulator input signal x(n) minus a delayed quantizer output signal y(n), i.e. x(n)−y(n−1), to generate the quantizer input signal s(n). Filter 904 can be any noise-shaping filter, such as filter 104. Quantizer 902 quantizes quantizer input signal s(n) in accordance with a non-linear quantization transfer function Q(s(n)). U.S. patent applications (i) Ser. No. 10/875,920, filed Jun. 24, 2004, entitled "Signal Processing with a Look-Ahead Modulator Having Time Weighted Error Values", and inventor John L. Melanson (referred to herein as "Melanson I"), (ii) Ser. No. 10/900,877, filed Jul. 29, 2004, entitled "Signal Processing with Look-Ahead Modulator Noise Quantization Minimization", and inventor John L. Melanson (referred to herein as "Melanson II"), and (iii) Ser. No. 10/995,731, filed Nov. 22, 2004, entitled "Look-Ahead Delta Sigma Modulator with Quantization Using Natural and Pattern Loop Filter Responses" filed Nov. 22, 2004, and inventor John L. Melanson (referred to herein as "Melanson III"), describe various exemplary look-ahead delta sigma modulators. Melanson I, Melanson II, and Melanson III are hereby incorporated by reference in their entireties. Filter 904 can be implemented using any topology, such as feed-forward or feedback topologies. Example loop filters are described in "Delta-Sigma Data Converters—Theory, Design, and Simulation", edited by Norsworthy, et al., 1997, IEEE Press, and ISBN 0-7803-1045-4.

Figure 1:
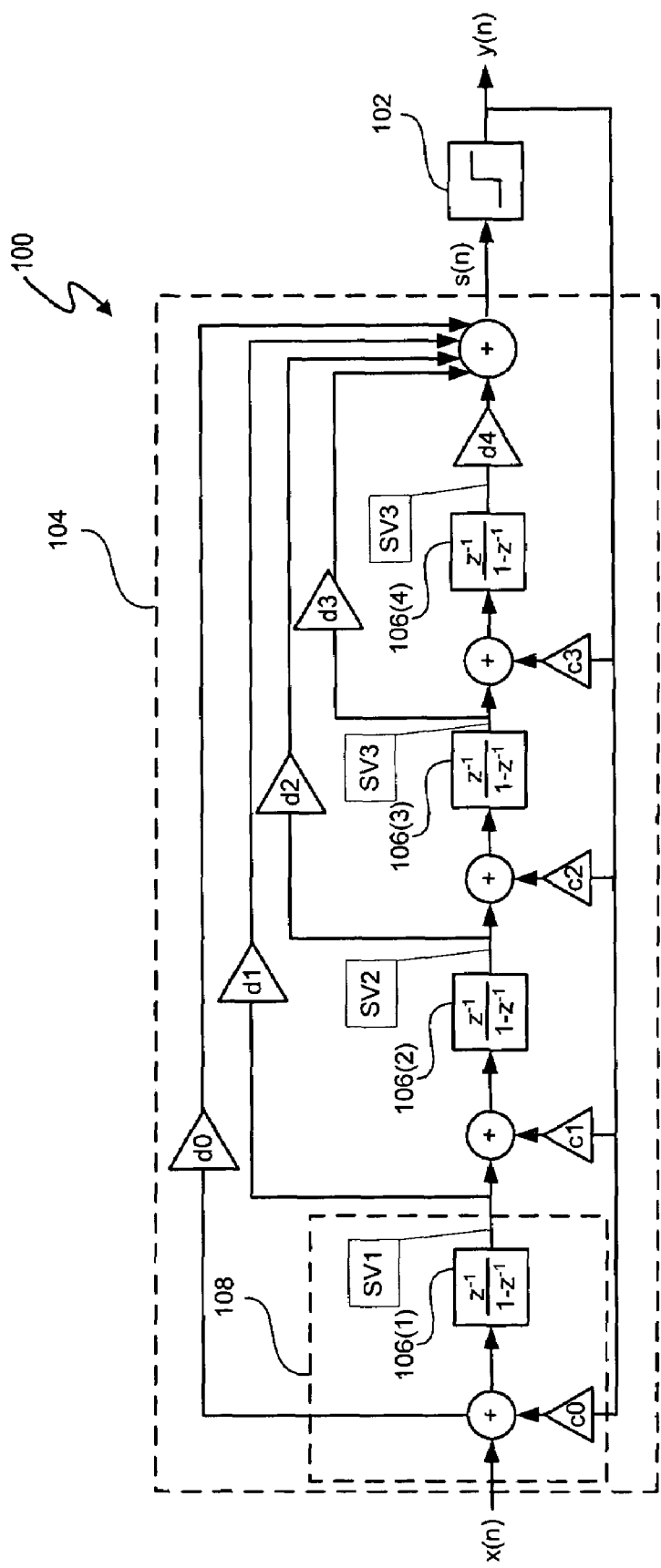
FIG. 1 (labeled prior art) depicts an exemplary delta sigma modulator with a monotonic quantizer.
Figure 1:
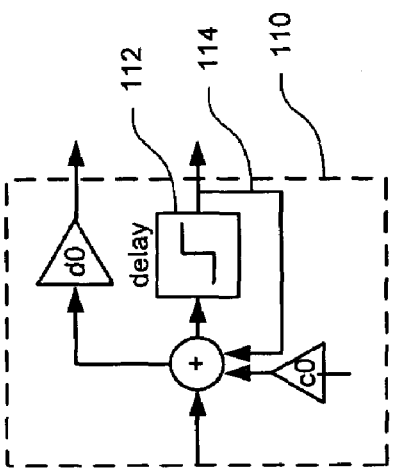
Figure 2:
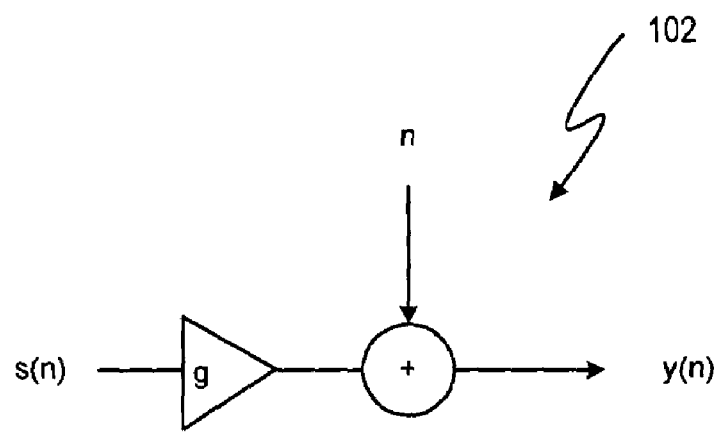
FIG. 2 (labeled prior art) depicts an exemplary delta sigma modulator quantizer model.
Figure 3:
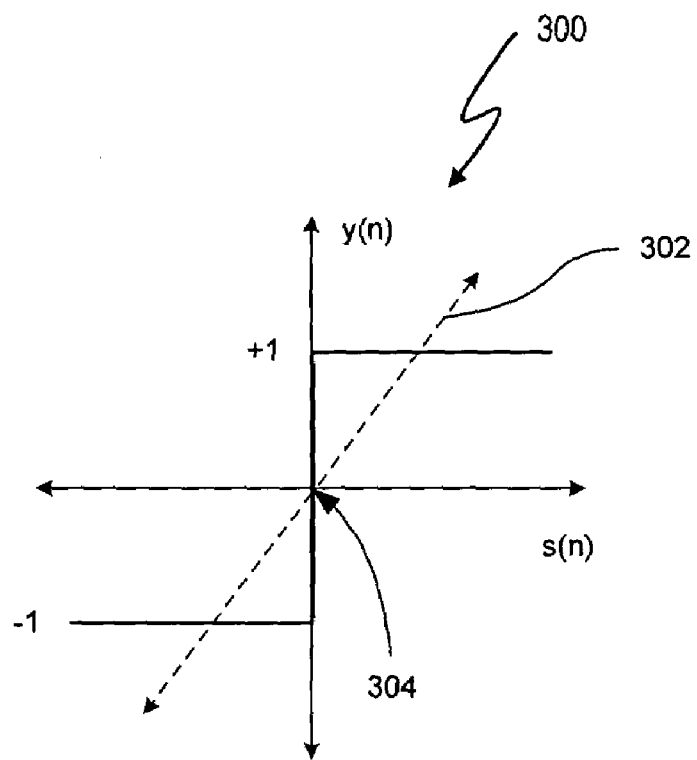
FIG. 3 (labeled prior art) depicts an exemplary monotonic, two-level quantization transfer function.
Figure 4:
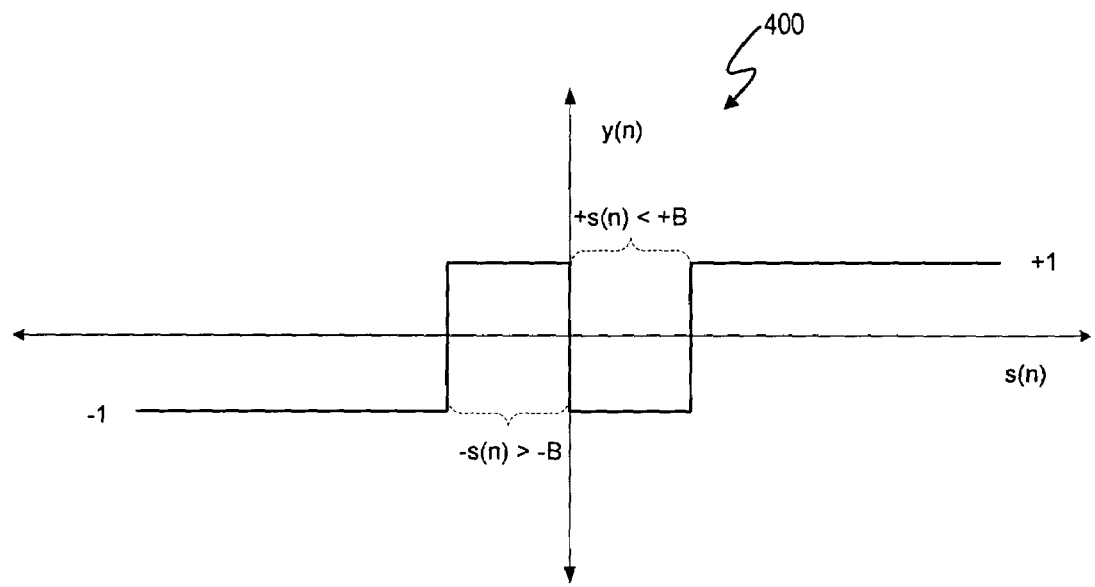
FIG. 4 (labeled prior art) depicts an exemplary single non-monotonic region quantization transfer function for dither emulation.
Figure 6:
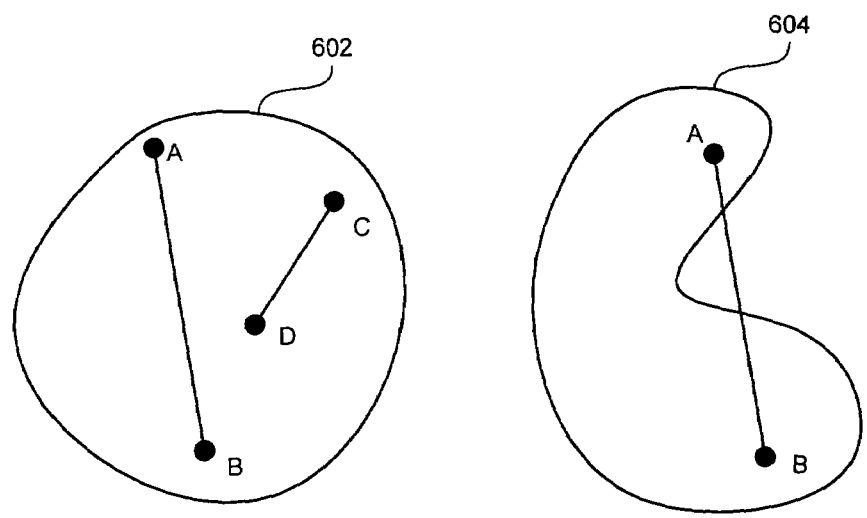
FIG. 6 (labeled prior art) depicts convex and nonconvex regions.

In one embodiment, filter 904 has N state variables, and N is an integer ≧3. Three of the state variables of filter 904 are represented by state variables $SV_1, \ldots, SV_K$. At least two of the state variables $SV_1, \ldots, SV_K$ have a nonlinear interrelationship that characterize, at least in part, one or more boundaries between two or more quantization regions of the quantizer output. The state variables $SV_1, \ldots, SV_K$ generated by filter 904 represent quantizer input data. Thus, the quantizer output function Q(s(n)) is a function of at least a subset of state variables $SV_1, \ldots, SV_K$, $(Q(s(n))=f(SV_1, \ldots, SV_K)$, and Q(s(n)) is nonlinear. In one embodiment, the quantizer function is a function of the J+1 most significant state variables, i.e. $Q(s(n))=f(SV_{N-J}, \ldots, SV_{N-1}, SV_N)$, $1 \leq J \leq N-1$, N represents the total number of filter 904 state variables, K<N, and $SV_N$ is the state variable associated with the last integrator of filter 904, e.g. for N=4, integrator 106(4) of FIG. 1. The latter integrators of look-ahead delta sigma modulators generally have a predominant effect on the quantization decision of quantizer 902. Thus, as described in more detail below, delta sigma modulator 900 can employ approximation techniques that place more emphasis on the latter integrators with an acceptable amount of error.

In general, look-ahead delta sigma modulators determine a quantization output from output candidate vectors and input vectors. The look-ahead depth refers to the dimension of each output candidate vector Yi used to determine output signal y(n). From a functional viewpoint, for time t, each output candidate vector Yi, i□{0,1,2, . . . , M-1}, is subtracted from an input vector Xt to obtain respective difference vectors Di, i□{0,1,2, . . . , M-1}, and Di=[Xt−Yi]. The leading bit of the best matching output candidate vector is chosen as the quantization output y(n). Melanson I, II, and III describe various exemplary systems and methods for determining quantization output y(n).

Figure 10:
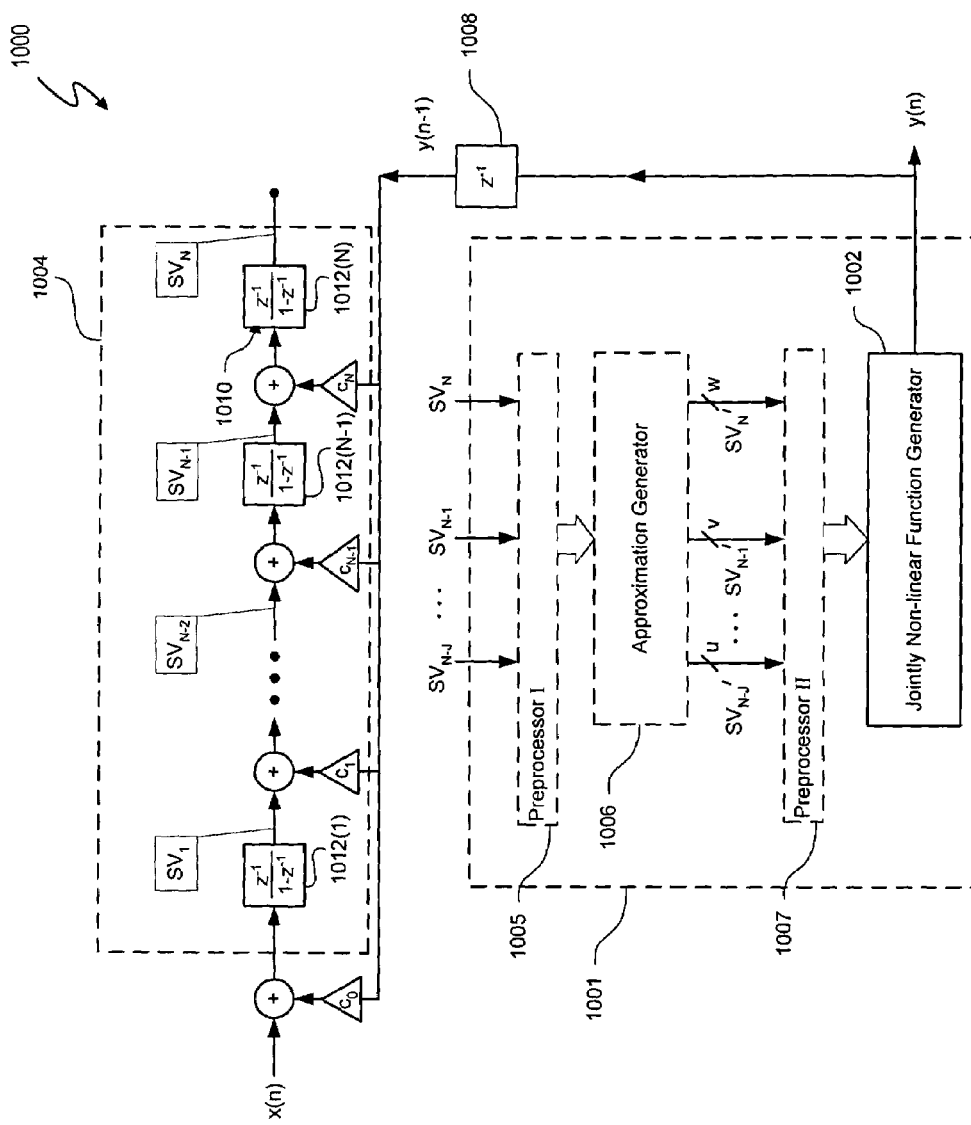
FIG. 10 depicts an exemplary lookahead, jointly non-linear delta sigma modulator that includes a function generator for quantization.

FIG. 10 depicts a lookahead, jointly non-linear delta sigma modulator 1000 that includes an Nth order noise shaping filter 1004, such as filter 104 and a quantizer 1001 implemented by a jointly non-linear function generator 1002. The look-ahead delta sigma modulator 1000 represents one embodiment of delta sigma modulator 900. The output data of each integrator of filter 104 represents the state variables $SV_N, SV_{N-1}, \ldots, SV_1$. The value of each state variable for each input x(n) is a function of the input x(n) and the topology of filter 1004 including the coefficients, $c_0, C_1, \ldots, C_{N-1}, C_N$ and feedback data y(n−1).

When look-ahead delta sigma modulators are implemented, a search determines the best output candidate vector. If the output candidate vector is M elements long (look-ahead depth of M), a 1 bit system, and no search pruning is performed, the search has 2^M output candidate vectors to process. Even with pruning, and simplifications, this search is still computationally expensive.

Melanson III describes an exemplary system and method for determining the quantizer output data y(n) for each time t using forced pattern response vectors (SPAT$_k$) and a natural input response vector (SNAT). SPAT$_i$ represents the response of a noise shaping filter, such as filter 1004, to 0 input and feedback from the k$^{th}$ output candidate vector. As described in Melanson III, the SPAT response vectors can be calculated once and stored. SNAT$_t$ represents the response of the filter to the input vector X$_t$ at time t and feedback forced to 0, X$_t$={x(n), x(n+1), . . . , x(n+M)}$_t$.

In addition to describing an exemplary system and method for reducing the number of pattern response vectors used to determine the quantization output y(n), Melanson III also describes an exemplary system of efficiently determining the best matching forced pattern response vector SPAT$_k$ $_{min}$ and selecting the value of quantization output y(n) as the leading bit of the best matching pattern response vector. The selected quantization output y(n) is fed back through delay 1008. The actual filter 1004 topology and implementation (e.g. software, hardware, or a combination of hardware and software plus coefficients) is a matter of design choice.

Once the filter topology is established and the forced pattern response vectors SPATs are determined, the quantizer can be implemented as a function generator 1002 using the state variables of filter 1004 as input data. Thus, quantizer output y(n) is determined by a quantization function of selected filter state variables, i.e. y(n)=Q (selected filter state variables). Thus, the jointly non-linear function generator can be viewed as a computational short-cut to implementing the effect that would have been achieved with look-ahead delta sigma modulators with standard full computations.

In one embodiment, assuming the topology of noise shaping filter 1004 can be arranged into a cascade of integrators, the last integrator 1010 has the largest effect on the selection of quantization output y(n), which is true even with multiple feedback loops as indicated by the denominators of each sub-system transfer function 1012(1), . . . , 1012(N−1), and 1012(N). Since the latter integrators have a predominant effect on the selection of quantization output y(n), in some embodiments of delta sigma modulator 1000 a subset of the state variables are approximated with successive increased approximations of earlier integrators. In some embodiments, only a subset of the state variables of filter 1004 are considered in determining the quantization output y(n). Thus, selected filter 1004 state variables $SV_N$, $SV_{N-1}, \ldots, SV_{N-J}$ form the inputs to optional preprocessor I 1005. Preprocessor I 1005 can preprocess the state variables by, for example, applying respective gains to one or more of the state variables or one or more combinations of the state variables. In another embodiment, the preprocessor I 1005 can combine one or more state variables.

If preprocessor I 1005 is used, the output of preprocessor I 1005 provides the inputs to approximation generator 1006. If preprocessor I 1005 is not used, the state variables are applied directly to approximation generator 1006. Approximation generator 1006 provides approximated state variables $SV_N'$, $SV_{N-1}', \ldots, SV_{N-J}'$ as input data to the jointly non-linear function generator 1002 if the preprocessor II 1007 is not used. Before approximating any state variable, each state variable is typically represented by between ten (10) and thirty (30) bits. In one embodiment, the state variable having a predominant influence on the value of the output signal y(n) are each approximated to varying degrees depending upon the influence of the particular state variable. Greater approximation results in less accuracy, but the trade-off in implementation costs can more than offset the loss of accuracy. The exact trade-off is a matter of design choice. For example, in one embodiment for N=5 and J=2 and each state variable is represented by 10 bits, state variable $SV_N'$ is represented by w=6 bits (i.e. an approximation of four (4) bits), $SV_{N-1}'$ is represented by v=5 bits, $SV_{N-2}'$ is represented by u=4 bits, and state variables $SV_{N-J-1}$ through $SV_1$ are approximated to zero (i.e. ignored). Because of the predominance of the latter state variables in determining the quantization output y(n), the approximations result in a slightly lower accuracy of quantization output y(n) but disproportionately decrease implementation costs. The preprocessor II 1007 is optionally used to further preprocess the state variables by, for example, applying respective gains to one or more of the approximated state variables or to one or more combinations of the approximated state variables. Generally, preprocessors I and II will perform distinct functions. Additionally, the input sample x(n) can also be used as an input by quantizer 1001 to determine the output y(n). By adding r delays to the input of filter 1004, future input samples x(n+1), x(n+2), . . . x(n+r) can also be used as inputs to quantizer 1001 to determine the output y(n), where r is an integer. In other embodiments, one or more functions of preprocessor I 1005 and/or preprocessor II 1007 are performed by filter 1004.

The approximation generator 1006 is optional. Filter 1004 or preprocessor I 1005 can provide one or more state variables (as preprocessed by preprocessor I 1005) directly to jointly non-linear function generator 1002. Additionally, approximation generator 1006 can be used with any delta-sigma modulator including look-ahead, non-look-ahead, jointly non-linear delta-sigma modulator, monotonic and non-monotonic delta-sigma modulators. Furthermore, depiction of approximation generator 1006 as a functional component of quantizer 1001 is generally arbitrary and a matter of design choice. Approximation generator 1006 can be logically considered as an independent, intermediary component between filter 1004 and quantizer 1001.

Figure 11:
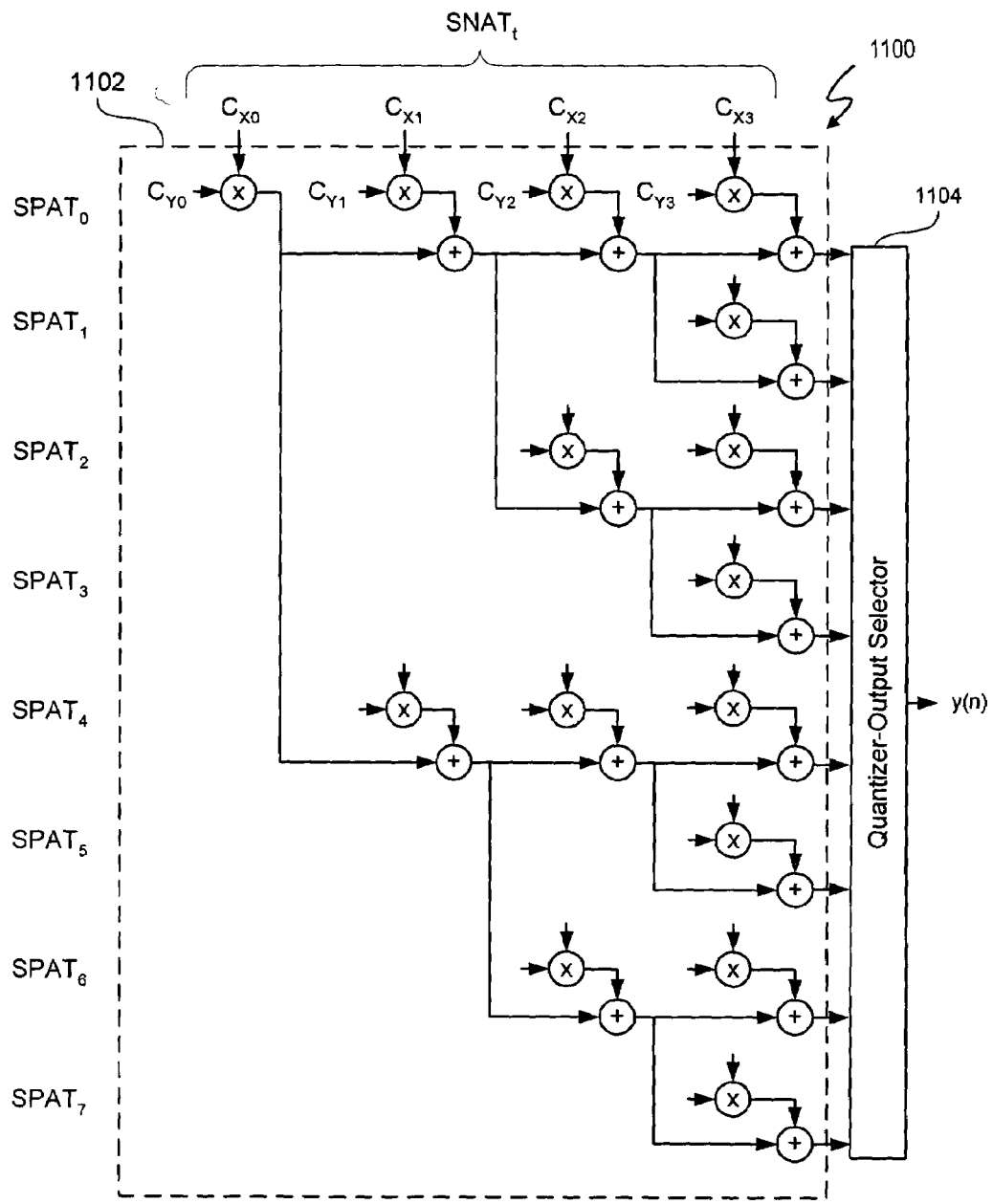
FIG. 11 depicts an exemplary function generator of the delta sigma modulator of FIG. 10.

FIG. 11 depicts an exemplary function generator 1100 representing one embodiment of the function generator 1002. The function generator 1100 determines a quantization output y(n) from state variables $SV_N'$, $SV_{N-1}'$, . . . , $SV_{N-J}'$ using the computation reduction scheme 1102 and quantizer-selector 1104. The function generator can be implemented using software instructions stored in a memory, such as a read-only memory (ROM) and/or using hardware such as an application specific integrated circuit (ASIC) or field programmable gate array (FPGA). The inputs to the function generator 1100 are the state variables $SV_N'$, $SV_{N-1}'$, . . . , $SV_{N-J}'$. As described below, the state variables $SV_N'$, $SV_{N-1}'$, . . . , $SV_{N-J}'$ are determined from the state variables $SV_N$, $SV_{N-1}$, . . . , $SV_{N-J}$ of filter 1004. Melanson III describes the full derivation and functionality of the determination of quantization output y(n) from the forced pattern response vectors SPATs and natural input response vector $SNAT_t$. As described in Melanson III, the computation reduction scheme 1102 can be expanded or contracted for any look-ahead depth. "$C_{Xj}$" represents the jth element of natural input response vector $SNAT_t$ using state variables $SV_N'$, $SV_{N-1}'$, . . . , $SV_{N-J}'$, i.e. the filter 1004 output response for the $j^{th}$ element of the M element input vector $X_t$ using state variables $SV_N'$, $SV_{N-1}'$, . . . , $SV_{N-J}'$, j={1, 2, . . . , M} and M represents the look-ahead depth. In one embodiment, the filter 1004 output response is the summation of state variables $SV_N'$, $SV_{N-1}'$, . . . , $SV_{N-J}'$. In general, the filter 904 topology determines the filter output response. The state variables can be weighted or unweighted. "$C_{Yrj}$" represents the jth element of the forced pattern response vector $SPAT_m$, r={1, 2, . . . , R} and R=number of forced pattern response vectors in computation reduction scheme 1102.

As described in Melanson III, in one embodiment quantizer-output selector 1104 determines the quantization output y(n) from the output candidate vector associated with $(SNAT_t \times SPAT_r)_{min}$. The function generator 1100 can also implement functions, using approximated or non-approximated filter state variables. For example, because of the dominance of later filter state variables, there are instances where the value(s) of one or more later state variables are completely determinative of the quantization output y(n). For example, if $SV_N$ is greater than A, y(n)=+1, and if $SV_N$ is less than −B, y(n)=−1.

Figure 12:
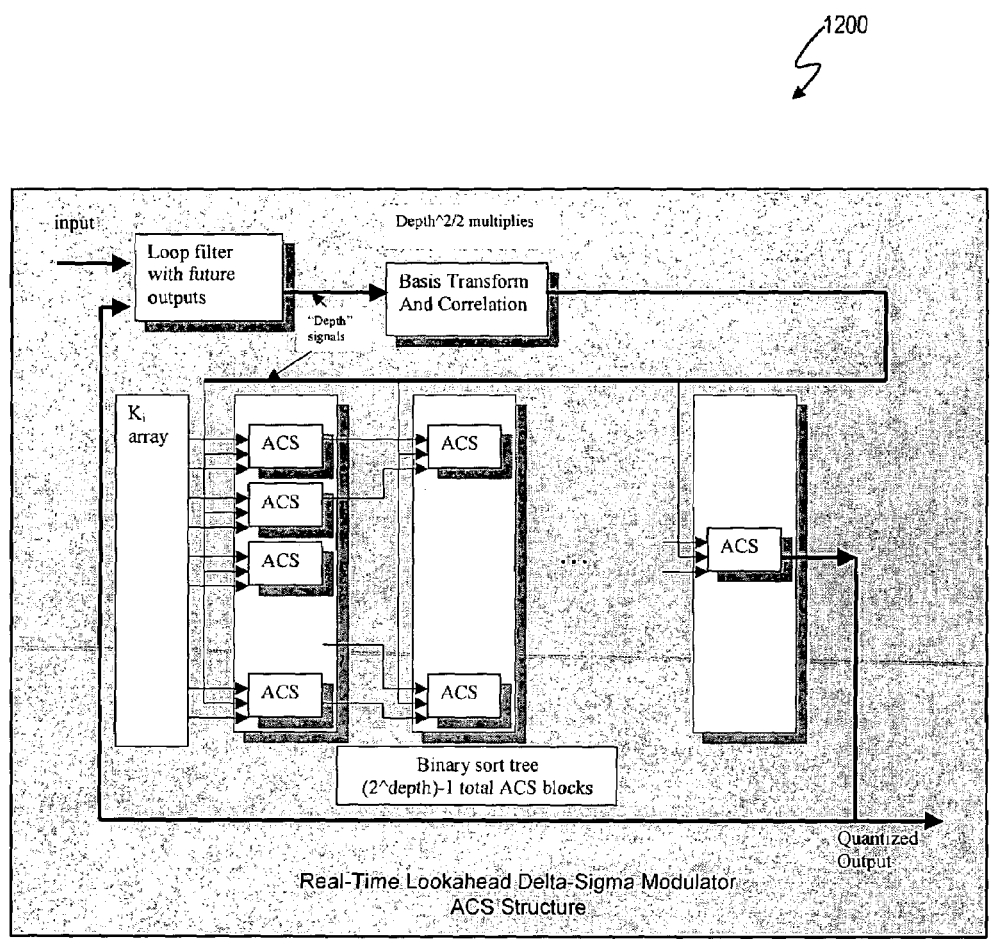
FIG. 12 depicts an add/compare/select network.

Melanson III also describes an add/compare/select (ACS) system 1200 depicted in FIG. 12 that can implement function generator 1002 using approximated or non-approximated state variables as inputs to determine $SNAT_t$. Melanson III recites an example that illustrates the concepts of ACS networks. The operation can be understood as follows. Assume a look-ahead depth of 4 (M=4), and:
e0=filter response to {1,0,0,0}
e1=filter response to {0,1,0,0}
e2=filter response to {0,0,1,0}
e3=filter response to {0,0,0,1}
Since the filter is a linear system, it follows that $SPAT_0$=filter response to {−1,−1,−1,−1}=−e0−e1−e2−e3.
Defining:
f0=e0·SNAT
f1=e1·SNAT
f2=e2·SNAT
f3=e3·SNAT Then:
$SNAT \cdot SPAT_0$=−f0−f1−f2−f3
and $SNAT \cdot SPAT_i$ for any "i" can be computed as a simple sum/difference of corresponding f values.

Figure 13:
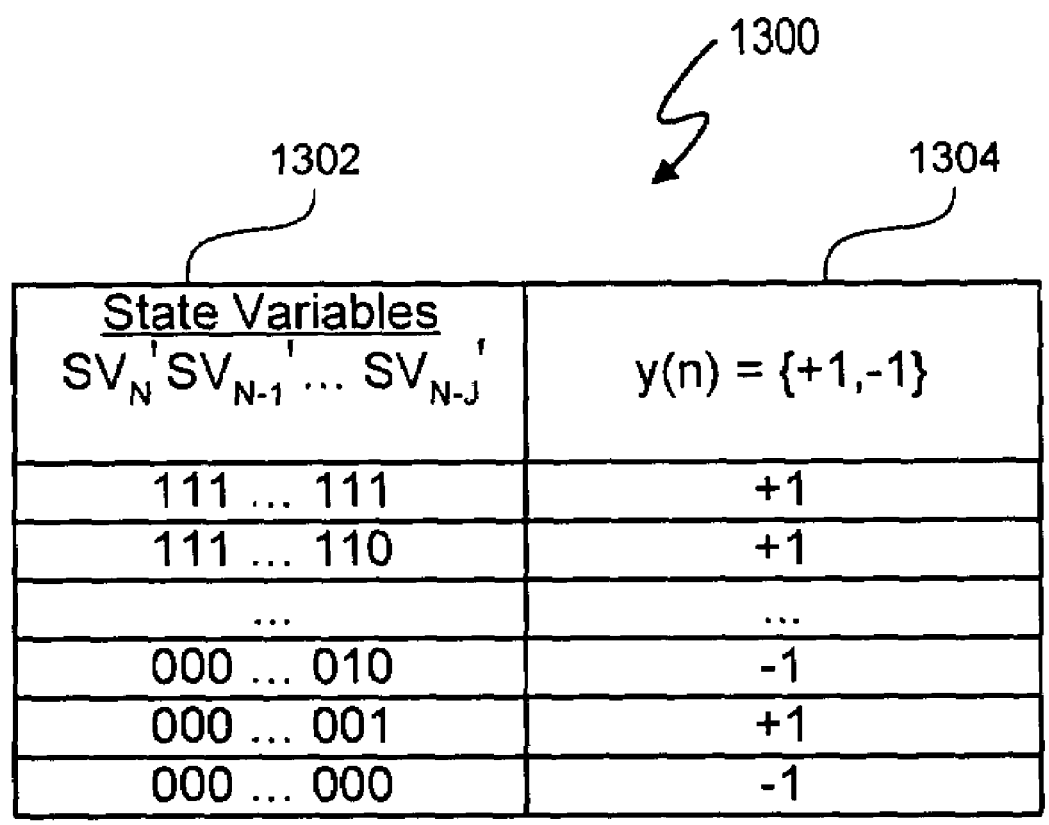
FIG. 13 depicts an example loop-up table embodiment of quantizer function generator.

FIG. 13 depicts an exemplary look-up table 1300 of function generator 1100. Rows in column 1302 of table 1300 contain the concatenated values of approximated state variables used to determine the quantization output y(n). Rows in column 1304 contain the values of quantization output y(n) associated with a corresponding value in column 1302. The actual values of quantization output y(n) can be determined using a variety of fill-in techniques. Three exemplary fill-in techniques are described below. The value of quantization output y(n) is depicted as an element of the set {+1,−1}, i.e. a one-bit delta sigma modulator. Multi-bit values can also be determined for y(n) using a multi-bit delta sigma modulator.

Before applying any approximations, state variables are generally represented by at least 10 bits and are typically represented by from 10 to 30 bits. The state variables can be approximated by rounding the state variables to smaller bit sizes, using more rounding for less influential state variables or by other approximation techniques, such as truncation. As an example, assume that with no approximation state variables $SV_i$ are represented by 10–30 bits. Using approximations, state variable $SV_N'$ is represented by w=6 bits, $SV_{N-1}'$ is represented by v=5 bits, and $SV_{N-2}'$ is represented by u=4 bits. These approximations require a 32 k ($2^6 \times 2^5 \times 2^4$) element look-up table 1300.

The table 1300 can be filled in by at least three techniques. In the first fill-in technique, because the concatenated state variables are approximated, each ith value in colunm 1302 represents a range of non-approximated state variable values generally evenly distributed on either side of the ith value in column 1302. For the ith value in column 1302, a quantization output y(n) value can be determined by delta sigma modulator 900 using the non-approximated state variable located in the center of the range of non-approximated state variable values centered around the ith value in column 1302. The determined value of quantization output y(n) is then entered into table 1300 corresponding to the ith value in column 1302. The first fill-in technique is performed for all values in column 1302. The other state variables (those not used by the table=$SV_{N-J-1}$ through $SV_1$) are assumed to be 0 in this fill-in technique.

In a second fill-in technique, an actual test signal X(n) is used to drive the look-ahead delta sigma modulator 900, using the non-approximated function generator such as function generator 1100. The result statistics are recorded in bins, one bin corresponding to each table entry in the approximation generator 1006. The number of y(n)=+1 decisions, and the number of y(n)=−1 decisions are recorded. After the end of the test signal, the statistics are evaluated, and for any bin that had a majority of +1's observed, the result is recorded as y(n)=+1 in the table 1300. Similarly, for any bin that had a majority of −1's observed, the result is recorded as y(n)=−1 in the table 1300. Where no test values are observed (i.e. the test signal did not generate a set of state variable values corresponding to an entry in the first column of table 1300), the first technique can be used to fill in those locations.

Figure 14A:
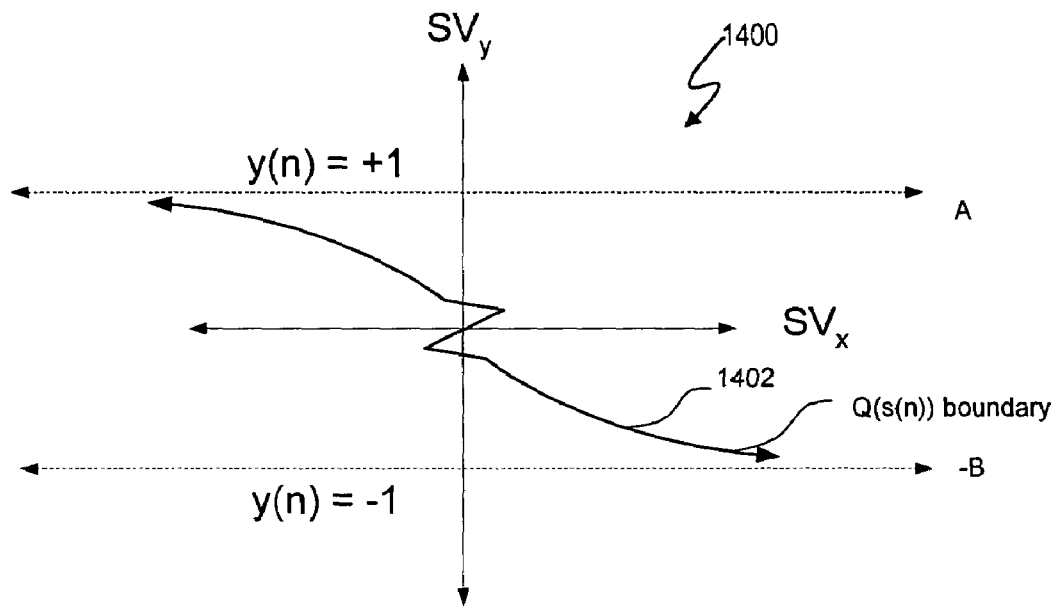
FIGS. 14A, 14B, 14C, 14D, 14E, and 14F depict exemplary embodiments of quantization region boundaries characterized by non-linear interrelationships between at least two delta sigma modulator filter state variables.
Figure 14G:
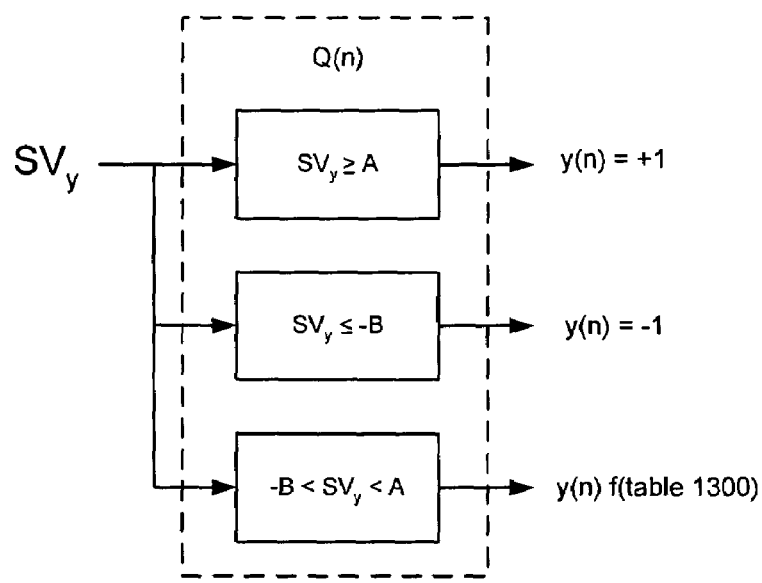
FIG. 14G depicts a functional implementation to generate the jointly non-linear function depicted in FIG. 14A.
Figure 14B:
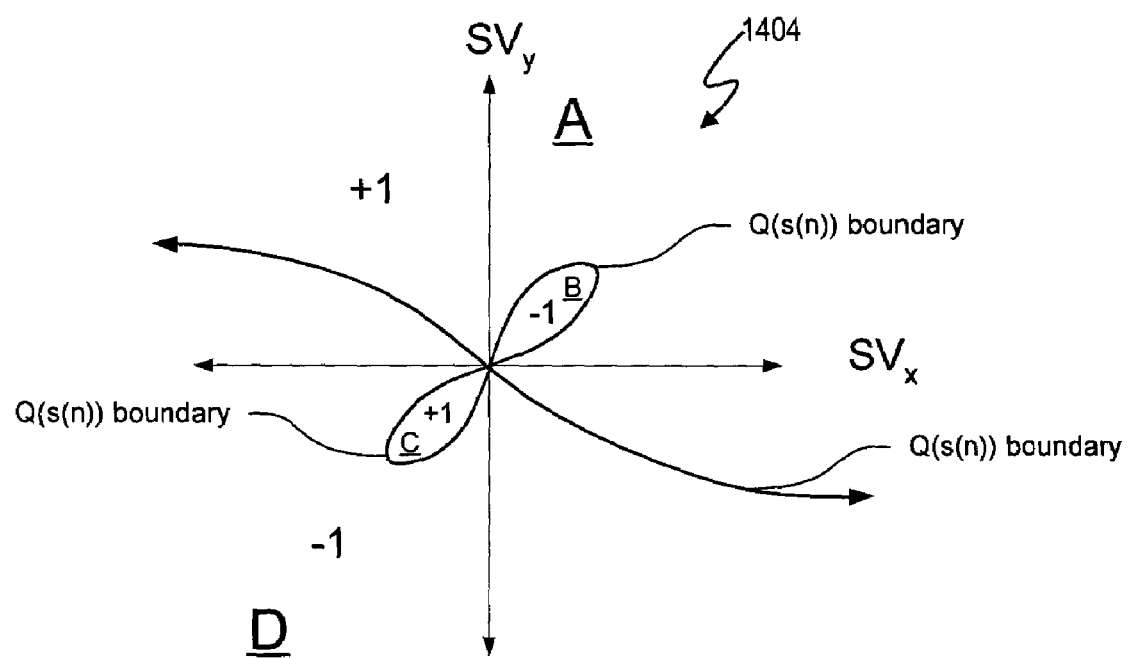

In a third fill-in technique, as depicted in FIGS. 14A and 14B, in one embodiment any time that the state variable $SV_N$ of the last integrator is (i) greater than A, the quantization output y(n) is always a +1 and (ii) less than −B, the quantization output y(n)=−1, where the absolute value of A and B may or may not be equal. Then the function can be simplified by making these initial comparisons, making the table 1300 smaller. Similarly, further comparisons can be made on other state variables used to determine the quantization output y(n). This technique generally makes for a less accurate function generator, but potentially still much better than the non-look-ahead delta sigma modulator.

In the instance that a software implementation of function generator 1002 is being used, the table look-up process can save many millions of instructions per second (MIPs) of computation. The table 1300 can have a $3^{rd}$ state, where either a +1 or a −1 is possible. In these cases, the deep search, i.e. standard, full look-ahead calculations are used. In this way, most quantizations can be performed by the table 1300, and a small percentage by the standard, full look-ahead calculation technique. In this way, the average computation load is reduced significantly.

FIGS. 14A, 14B, 14C, 14D, 14E, and 14F depict exemplary embodiments of non-linear interrelationships between at least two state variables of filter 904 that, at least in part, characterize one or more boundaries of one or more quantization regions of the quantizer transfer function Q(s(n)).

FIG. 14A depicts a 2-dimensional slice of an N-dimensional jointly non-linear function 1400. The Q(s(n)) decision line 1402 represents the non-linear boundary between two quantization regions, y(n)=+1 and y(n)=−1. The boundary between quantization regions +1 and −1 are characterized by the non-linear interrelationship between state variables $SV_x$ and $SV_y$ of filter 904. The quantization regions +1 and −1 can represent any level of quantization of quantizer 902. For example, a one-bit delta sigma modulator has by definition only two levels of quantization. A multi-bit delta sigma modulator has multiple levels of quantization. The jointly non-linear function 1400 can define the quantization regions for any quantization level. Thus, for each quantization level, the complete jointly non-linear function is multi-dimensional based on the number of state variables N used to determine the quantization output y(n).

FIG. 14G depicts a functional implementation to generate Q(s(n)), the jointly non-linear function 1400. In one embodiment, state variable $SV_y$ represents a latter (i.e. more significant) state variable, such as $SV_N$, relative to an earlier (i.e. less significant) state variable $SV_x$, such as $SV_{N-1}$. When state variable $SV_y \geq A$ and state variable $SV_y \leq -B$, the quantizer output y(n) is determined solely by the value of state of state variable $SV_y$. When $-B < SV_y < A$, output y(n) is determined, for example, by using the lookup table 1300.

FIG. 14B also depicts the non-linear interrelationships between state variables of filter 904 that characterize boundaries between quantization regions of the quantizer transfer function Q(s(n)). The jointly non-linear function 1404 also depicts multiple quantization region boundaries characterized by the non-linear interrelationships between two state variables, $SV_x$ and $SV_y$, thus, defining a non-monotonic quantization transfer function for one or more quantization levels. Furthermore, the quantization regions A and D are nonconvex.

Figure 14C:
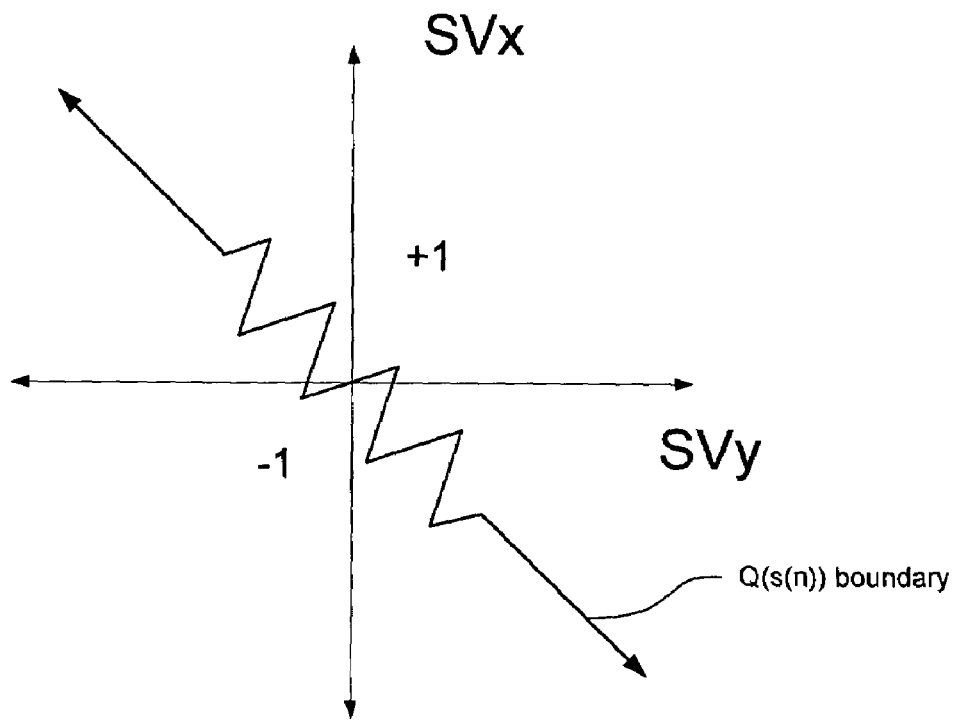
Figure 14D:
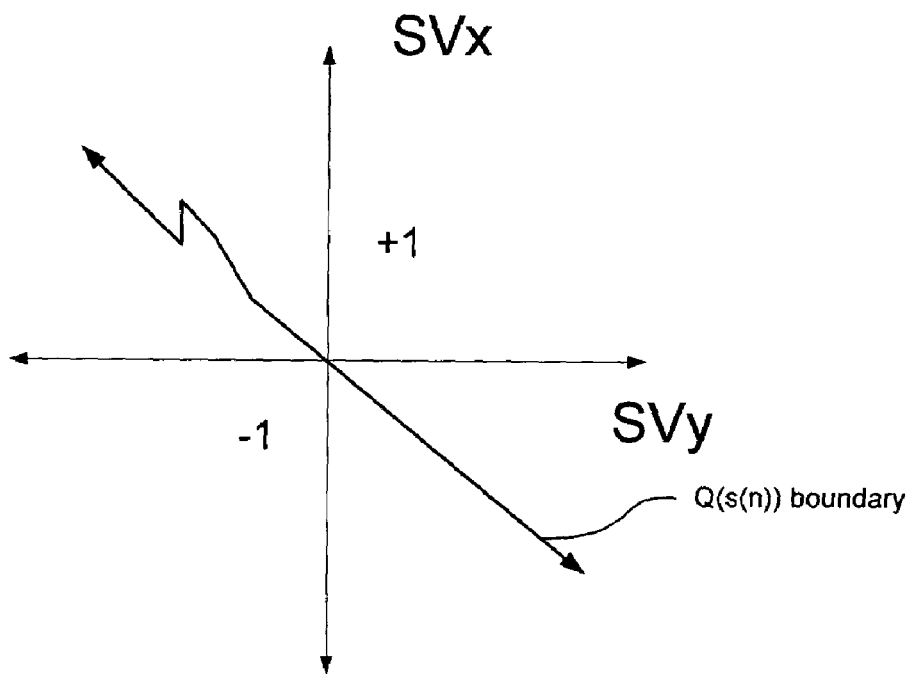

FIGS. 14C and 14D depict further embodiments of the non-linear interrelationships between state variables of filter 904 that characterize boundaries between nonconvex quantization regions of the quantizer transfer function Q(s(n)).

Figure 14E:
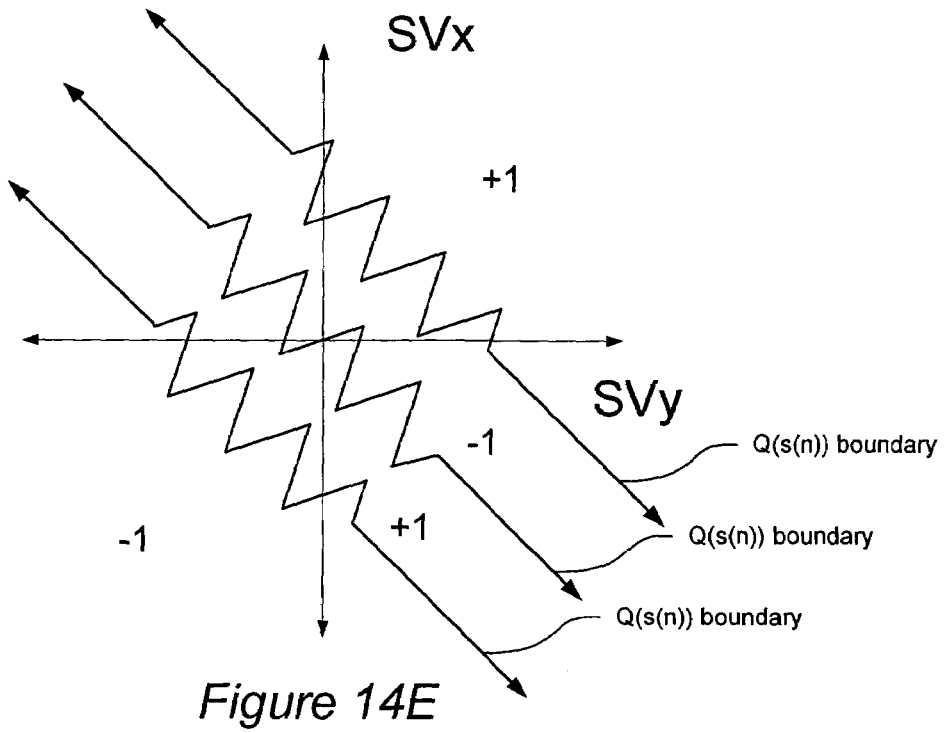
Figure 14F:
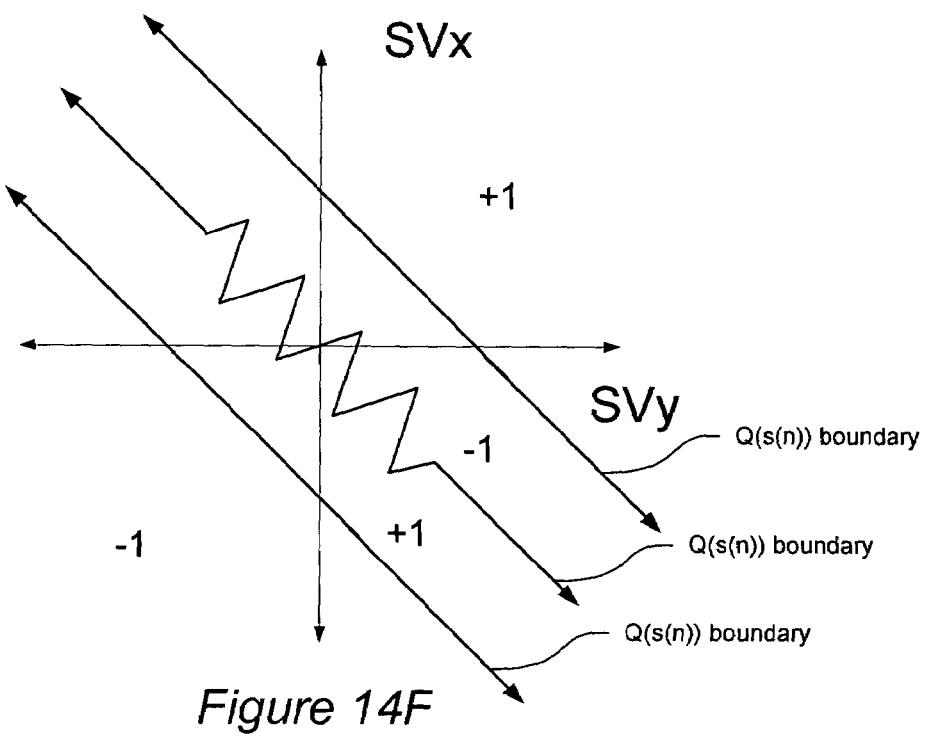

FIGS. 14E and 14F depict further embodiments of the non-linear interrelationships between state variables of filter 904 that characterize boundaries between non-monotonic, nonconvex quantization regions of the quantizer transfer function Q(s(n)).

Figure 5A:
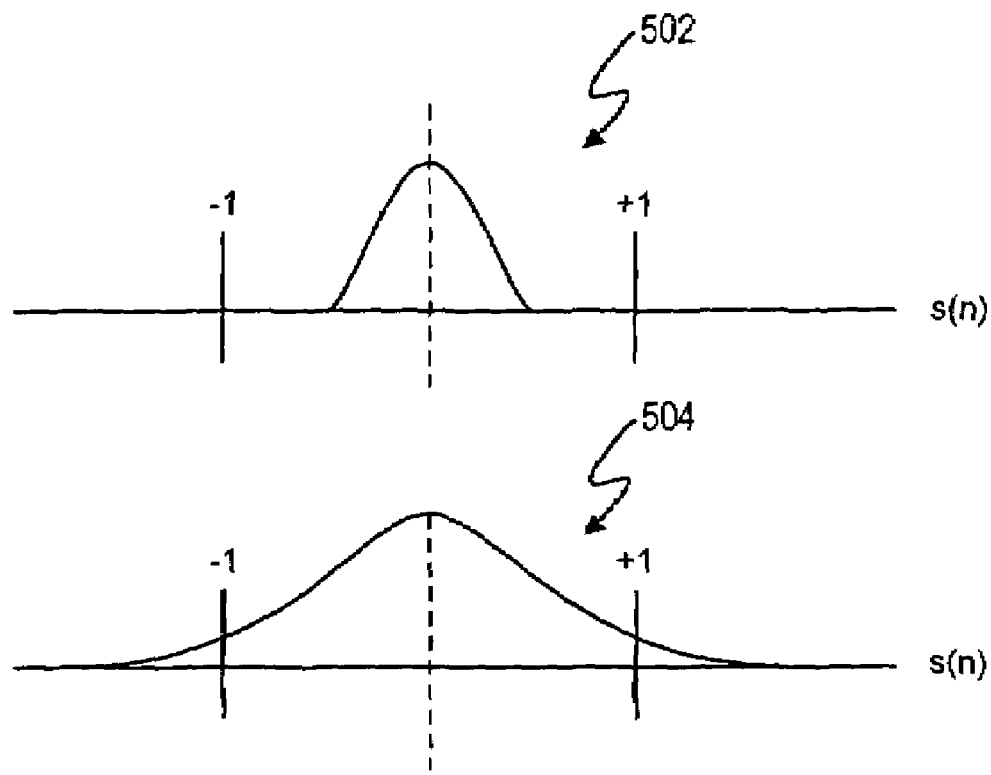
FIG. 5A (labeled prior art) depicts exemplary probability density functions of each quantizer input signal during operation at small and large input signal levels.
Figure 5B:
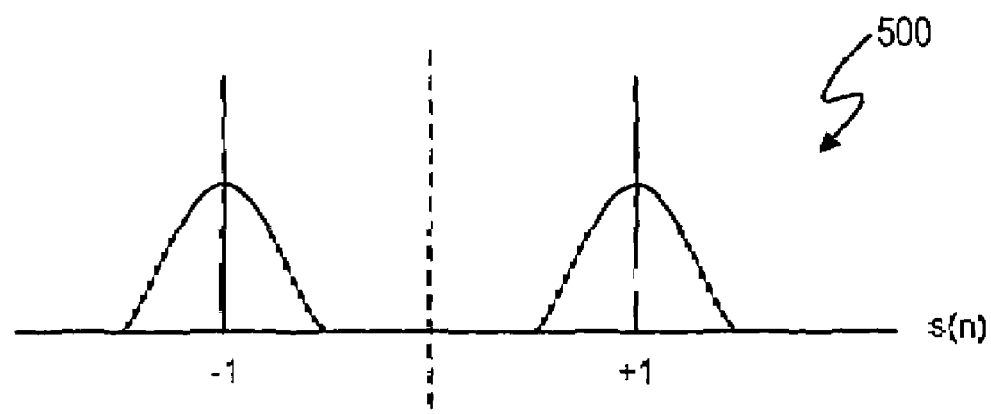
FIG. 5B (labeled prior art) depicts an exemplary near ideal probability density function for each delta sigma modulator quantizer input signal.
Figure 7:
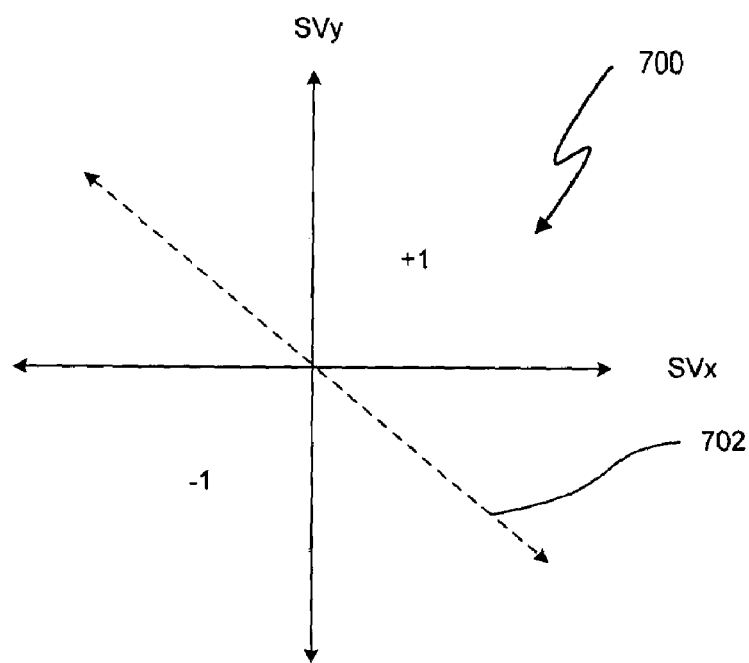
FIG. 7 (labeled prior art) depicts the interrelationship of two noise shaping filter state variables with respect to the output of a monotonic quantizer.
Figure 8:
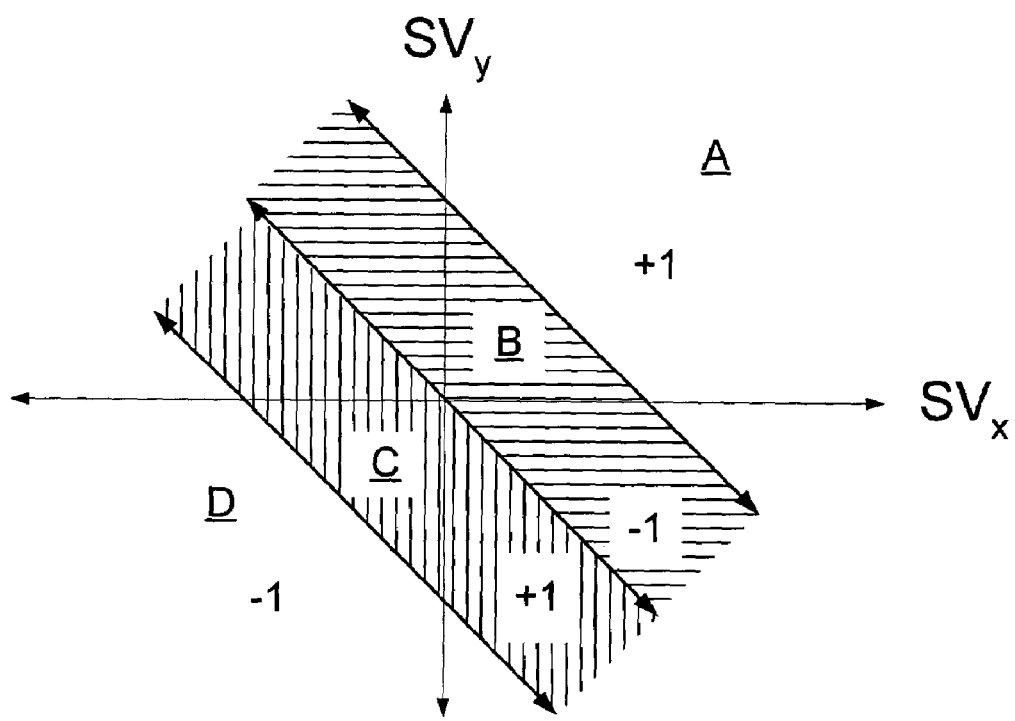
FIG. 8 (labeled prior art) depicts the interrelationship of two noise shaping filter state variables with respect to the output of a dithering quantizer.
Figure 15:
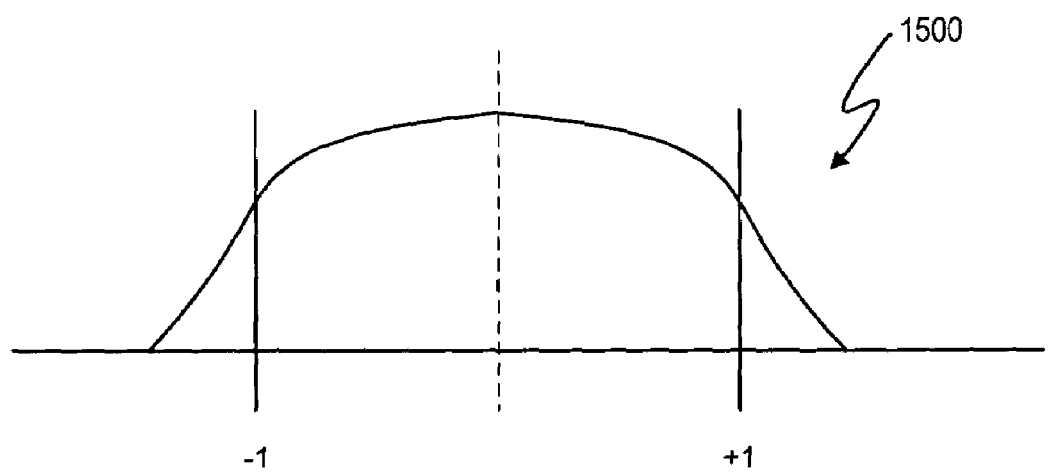
FIG. 15 depicts an exemplary probability density function of each quantizer input signal.

FIG. 15 depicts a PDF 1500 of the quantizer input signal s(n) when processed by quantizer 902. Because of the positive feedback for lower level quantizer input signals x(n), the lower level delta sigma modulator input signals x(n) are effectively pushed out and the larger level delta sigma modulator input signals x(n) more closely conform to the ideal PDF depicted in FIG. 5B. The delta sigma modulator 900 has achieved up to 10 db SNR improvement compared to comparable, conventional delta sigma modulators with monotonic quantizers.

Figure 16:
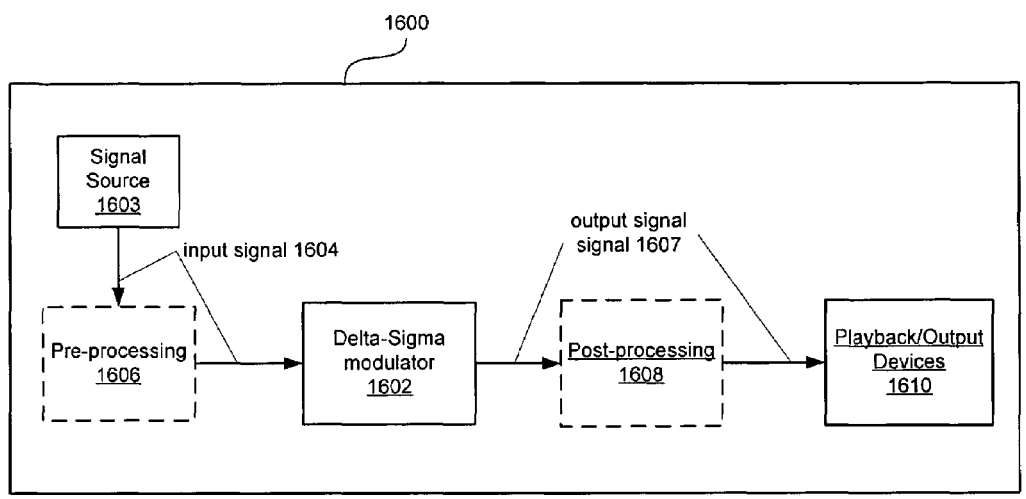
FIG. 16 depicts an exemplary signal processing system that includes a look-ahead modulator, an output device and process, and an output medium.

Referring to FIG. 16, signal processing system 1600 depicts one embodiment of a signal processing system that includes delta sigma modulator 1602. Delta sigma modulator 1602 represents an embodiment of delta sigma modulator 900. Signal processing system 1600 is particularly useful for high-end audio applications such as super audio compact disk ("SACD") recording applications. Signal processing system 1600 processes an input signal 1604 generated by an input signal source 1603. The input signal 1604 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1604 may be an audio signal, a video signal, an audio plus video signal, and/or other signal type. Generally, input signal 1604 undergoes some preprocessing 1606 prior to being modulated by delta sigma modulator 1602. For example, pre-processing 1606 can involve an interpolation filter to oversample a digital input signal 1604 in a well-known manner. Pre-processing 1606 can include an analog-to-digital converter to convert an analog input signal 1604 into a digital signal. Pre-processing 1606 can also include mixing, reverberation, equalization, editing, out-of-band noise filtering and other filtering operations.

In the digital domain, pre-processing 1606 provides discrete input signals x[n] to look-ahead modulator 1602. Each discrete input signal x[n] is an N-bit signal, where N is greater than one. As previously described in more detail, delta sigma modulator 1602 processes M input signals x[n] and patterns of M output candidates y[n] to determine an output signal 1607 from the output candidates corresponding to each input signal x[n]. Output signal 1607 is, for example, a collection of one-bit output values. The output signal 1607, thus, becomes an encoded version of the input signal 1604.

Figure 17:
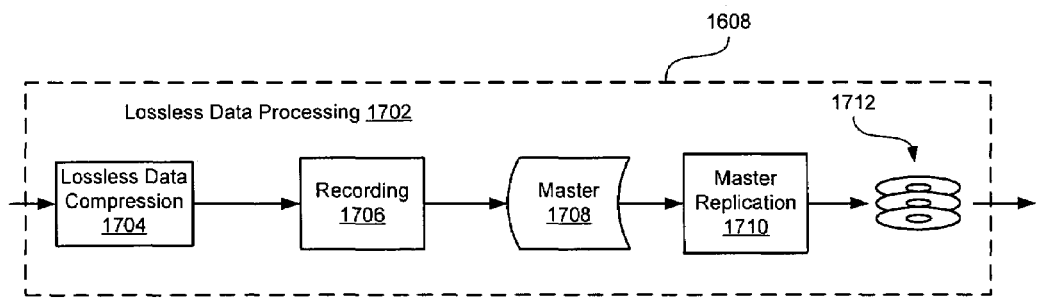
FIG. 17 exemplary depicts post-processing operations in an embodiment of the signal processing system of FIG. 16.

Referring to FIGS. 16 and 17, signal processing system 1600 typically includes post-processing 1608 to post-process the output signal 1607 of look-ahead modulator 1602. Post-processing 1608 can include lossless data processing 1702. For SACD audio mastering, there is a lossless data compression stage 1704, followed by a recording process 1706 that produces the actual pits that are burned into a master storage medium 1708. The master storage medium 1708 is then mechanically replicated to make the disks (or other storage media) 1712 available for widespread distribution. Disks 1712 are, for example, any variety of digital versatile disk, a compact disk, tape, or super audio compact disk. Playback/output devices 1610 read the data from the disks 1712 and provide a signal output in a format perceptible to users. Playback/output devices 1610 can be any output devices capable of utilizing the output signal 1607. Thus, the storage media 1708 and 1712 include data encoded using signal modulation processes achieved using delta sigma modulator 1602.

Although the present invention has been described in detail, it should be understood that various changes, substitutions and alterations can be made hereto without departing from the spirit and scope of the invention as defined by the appended claims.

What is claimed is:

1. A signal processing system comprising:
   a jointly nonlinear delta sigma modulator comprising:
      a noise shaping filter to process a signal and generate N state variables, wherein N is greater than or equal to two; and
      a quantizer to quantize quantizer input data determined from at least a subset of the N state variables in accordance with a nonlinear quantization transfer function, wherein one or more boundaries between quantization regions for at least one quantization level are characterized at least in part by a nonlinear interrelationship between at least two of the state variables.

2. The signal processing system as in claim 1 wherein the boundary between at least two quantization regions is nonconvex.

3. The signal processing system as in claim 2 wherein N is greater than or equal to three, and the boundaries between at least two quantization regions are nonconvex in N-dimensions.

4. The signal processing system as in claim 2 wherein N is greater than or equal to three, and the boundary between at least two quantization regions is nonconvex in less than N-dimensions.

5. The signal processing system as in claim 1 wherein the noise shaping filter comprises N integrators and the state variables represent output values of at least a subset of the integrators during successive, discrete times.

6. The signal processing system as in claim 5 wherein the subset of the integrators consists of the Nth integrator through the N-$x^{th}$ integrators, wherein $2 \leq x \leq N-1$.

7. The signal processing system as in claim 1 wherein the noise shaping filter comprises an infinite impulse response filter.

8. The signal processing system as in claim 1 further comprising:
   a processor; and
   a memory coupled to the processor and storing processor executable code to implement the noise shaping filter and the quantizer.

9. The signal processing system as in claim 1 wherein during operation of the delta sigma modulator the quantizer input data is at least a subset of the N state variables.

10. The signal processing system as in claim 9 wherein during operation of the delta sigma modulator the quantizer input data comprises state variables from a first integrator and a second integrator of the filter and the state variables of the first and second integrators have a non-linear interrelationship with respect to boundaries in the quantization transfer function.

11. The signal processing system as in claim 1 wherein the quantizer input data is derived from audio input signal data.

12. The signal processing system as in claim 1 further comprising:
   signal processing and recording equipment to process output data from the quantizer and record the processed output data on storage media.

13. The signal processing system as in claim 1 wherein the quantizer input data comprises an approximation of at least a subset of the N state variables.

14. A method of processing a signal using a jointly nonlinear delta-sigma modulator that includes a noise shaping filter having N state variables, the method comprising:
   filtering an input signal to the jointly nonlinear delta-sigma modulator using the noise shaping filter to generate respective quantizer input data from the N state variables, wherein N is greater than or equal to two; and
   quantizing the quantizer input data in accordance with a nonlinear quantization transfer function, wherein one or more boundaries between quantization regions for at least one quantization level are characterized at least in part by a nonlinear interrelationship between at least two of the state variables.

15. The method as in claim 14 wherein the boundary between at least two quantization regions is nonconvex.

16. The method as in claim 15 wherein N is greater than or equal to three, and the boundaries between at least two quantization regions are nonconvex in N-dimensions.

17. The method as in claim 14 wherein N is greater than or equal to three, and the boundary between at least two quantization regions is nonconvex in less than N-dimensions.

18. The method as in claim 14 wherein the noise shaping filter comprises N integrators and the state variables represent output values of at least a subset of the integrators during successive, discrete times.

19. The signal processing system as in claim 18 wherein the subset of the integrators consists of the Nth integrator through the (N-x)th integrators, wherein $2 \leq x \leq N-1$.

20. The method as in claim 14 wherein filtering an input signal to the jointly nonlinear delta-sigma modulator using the noise shaping filter to generate respective quantizer input data further comprises:
   generating state variables from at least a first integrator and a second integrator of the filter and the state variables of the first and second integrators have a non-linear interrelationship with respect to boundaries in the quantization transfer function.

21. The method as in claim 14 wherein the input signal data sample comprises audio input signal data.

22. The method as in claim 14 further comprising:
   recording quantized quantizer input signal data on storage media.

23. A method of quantizing an input signal using nonlinearly related input data and a nonlinear quantization transfer function, the method comprising:
   receiving input signal samples;
   filtering the input signal samples to generate digital filter state variables; and
   applying a nonlinear quantization transfer function to at least a subset of the state variables to generate an output signal, wherein one or more boundaries between quantization regions for at least one quantization level are characterized at least in part by a nonlinear interrelationship between at least two of the state variables.

24. The method as in claim 23 wherein the input signal is comprised of audio digital signal samples.

25. An apparatus comprising:
   means to filter input signal samples to generate digital filter state variables representing state variables of a multi-order digital filter; and
   means to quantize at least a subset of the state variables using a nonlinear quantization transfer function, wherein one or more boundaries between quantization regions for at least one quantization level are characterized at least in part by a nonlinear interrelationship between at least two of the state variables.

* * * * *